(12) United States Patent
Rodmacq et al.

(10) Patent No.: US 7,138,193 B2
(45) Date of Patent: Nov. 21, 2006

(54) DATA STORAGE MEDIUM WITH LATERALLY MAGNETIZED PAD AND METHOD FOR MAKING SAME

(75) Inventors: Bernard Rodmacq, Veurey-Voroize (FR); Stéphane Landis, Martin le Vinoux (FR); Bernard Dieny, Lars en Vercors (FR)

(73) Assignee: Commissariat A l'Energie Atomique, Paris (FR)

( * ) Notice: Subject to any disclaimer, the term of this patent is extended or adjusted under 35 U.S.C. 154(b) by 91 days.

(21) Appl. No.: 10/482,465

(22) PCT Filed: Jul. 2, 2002

(86) PCT No.: PCT/FR02/02299

§ 371 (c)(1),
(2), (4) Date: Dec. 31, 2003

(87) PCT Pub. No.: WO03/005349

PCT Pub. Date: Jan. 16, 2003

(65) Prior Publication Data
US 2004/0151947 A1    Aug. 5, 2004

(30) Foreign Application Priority Data
Jul. 4, 2001  (FR) .................................. 01 08869

(51) Int. Cl.
*G11B 5/74*    (2006.01)

(52) U.S. Cl. ................. 428/826; 428/848.3; 428/848.5

(58) Field of Classification Search ..................... None
See application file for complete search history.

(56) References Cited

U.S. PATENT DOCUMENTS

| | | | |
|---|---|---|---|
| 6,347,016 B1 * | 2/2002 | Ishida et al. ................... 360/17 |
| 6,495,240 B1 * | 12/2002 | Wada et al. ................. 428/156 |
| 6,852,431 B1 * | 2/2005 | Fukutani et al. ............ 428/826 |
| 6,858,328 B1 * | 2/2005 | Ishida et al. ................ 428/826 |
| 2004/0043256 A1 * | 3/2004 | Tsubata et al. ........ 428/694 SG |

FOREIGN PATENT DOCUMENTS

| JP | 11-296849 A | * 10/1999 |
|---|---|---|
| JP | 2000-293842 A | * 10/2000 |
| JP | 2000-339681 A | * 12/2000 |

OTHER PUBLICATIONS

Chou et al., "Nanolithographically Defined Magnetic Structures and Quantum Magnetic Disk (Invited)", Apr. 15, 1996, American Institute of Physics, J. Appl. Phys., vol. 79, No. 8, pp. 6101-6106.

* cited by examiner

*Primary Examiner*—Kevin M. Bernatz
(74) *Attorney, Agent, or Firm*—Thelen Reid & Priest

(57) ABSTRACT

An information storage medium with an array of laterally magnetized dots, as well as a process for producing this medium is disclosed. Each dot (2) contains at least one magnetic domain formed by a thin layer (4) of at least a magnetic material laterally covering this flat material and deposited at oblique incidence relative to the normal (z) to the plane (6) of the array. The invention applies in particular to computer hard drives.

7 Claims, 3 Drawing Sheets

DATA STORAGE MEDIUM WITH LATERALLY MAGNETIZED PAD AND METHOD FOR MAKING SAME

CROSS-REFERENCE TO RELATED APPLICATION

This application claims priority based on International Patent Application No. PCT/FR02/02299, entitled "Information Storage Medium with Laterally Magnetised Dot Array, and Process for Producing Said Medium" by Bernard Rodmacq, Stephane Landis, and Bernard Dieny, which claims priority of French application no. 01 08869, filed on Jul. 4, 2001, and which was not published in English.

TECHNICAL FIELD

The present invention concerns an information storage medium, as well as a process for producing this medium.

It applies especially to hard computer drives.

PRIOR ART

An information storage medium, or memory, is currently constituted by a thin and continuous layer of ferromagnetic grains. The magnetisation of these grains is directed in the plane of the layer and each bit of information is made up of several grains whereof all magnetisation is parallel to the same direction.

If this direction is defined as corresponding to a zero, opposite magnetisation will be defined as corresponding to a 'one' in binary notation. A read/write head, while hovering above the layer of ferromagnetic grains, can thus code information by locally creating a magnetic field for orienting magnetisation of each <<bit>> in one direction or the other.

The density of the information stored on such a medium is limited by the size of the <<bits>> and by the transition zones. In order to increases this density, various solutions have already been proposed:

utilising a continuous magnetic material whereof the magnetisation is perpendicular to the plane of the layer, utilising a 'discrete' medium, that is, an array of magnetic dots independent of one another, each dot being monodomain, that is, corresponding to a single magnetic domain, the latter itself corresponding to an information bit. In this respect, reference is made to the following document:

[1] S. Y. Chou, P. R. Krauss, L. Kong, 'Nanolithographically defined magnetic structures and quantum magnetic disk', Journal of Applied Physics 79, 6101 (1996).

In the event where magnetisation of the magnetic material is parallel to the plane of the array of dots (planar magnetisation), each dot can be made monodomain by adjusting its shape (ellipse, for example), so as to favour only two directions of magnetisation. But this type of array is more complicated to manufacture than an array of dots in a square or rectangular shape.

In the event where magnetisation of the magnetic material is perpendicular to the plane of the array, the monodomain state is easier to obtain, and dots having a square or circular section can be used.

Nevertheless, the signal detected by the reading head is in principle weaker, as such materials with perpendicular magnetisation are generally alloys or multilayers based on a magnetic element and a non-magnetic element, which reduces the field created in the vicinity of the dots.

Furthermore, in the case of a multilayer, it is known that the number of repetitions cannot be increased indefinitely (in order to increase the radiated field) since the magnetisation tends to be oriented progressively in the plane under the effect of the demagnetising field.

DESCRIPTION OF THE INVENTION

The present invention proposes an information storage medium, comprising an array of magnetic dots, said medium exhibiting good performance both for reading and for writing information.

Precisely, the object of the present invention is an information storage medium, said medium being characterised in that it comprises an array of dots of submicronic dimensions, said array being formed on a substrate, each dot containing at least one magnetic domain which has a direction of magnetisation and corresponds to a bit defined by this direction of magnetisation, said magnetic domain being formed by a thin layer of at least one magnetic material laterally covering said dot.

According to a preferred embodiment of the medium forming the object of the invention, the direction of magnetisation is perpendicular to the plane of the array of dots.

The invention also concerns a process for producing the information storage medium which is the object of the invention, wherein the magnetic material is deposited onto the dots by sending to the latter a first flux of atoms of this material at an oblique incidence relative to the normal to the plane of the array, each dot shadowing the dot which follows it in the direction of the first flux, and the magnetic signal resulting from the magnetic material deposited on top of the dots and at the base of the trenches separating rows of dots is neutralised, so that only a magnetic signal generated by the material deposited on the flank of the dots subsists.

The magnetic material may be selected from the group comprising iron, nickel, cobalt, alloys of the latter and magnetic materials having strong magnetisation, or one of the materials of this group, to which is added one or a plurality of other elements, in variable quantity, for example selected from chromium, tantalum, platinum, molybdenum and terbium, these elements enabling the magnetic properties of the thin layer to be adjusted, such as the coercivity, the saturation magnetisation and the magnetic anisotropy of this thin layer.

According to a particular embodiment of the process forming the object of the invention, a resin covers the top of the dots before the magnetic material is deposited and this resin is eliminated after this magnetic material has been deposited, to thus obtain a first deposit on the sides of the dots.

In this case, a second flux of atoms of a neutralisation material can be sent to the array of dots at the same time as the first flux is sent and at a normal incidence to the plane of the array or at an oblique incidence relative to the normal to the plane of the array, with an angle of incidence opposite that of the first flux relative to this normal, with the intensity of the second flux and the neutralisation material being selected so that the alloy thus formed at the base of the trenches with the magnetic material has magnetic properties different to those of the first deposit obtained on the sides of the dots.

In the present invention, the first flux and at least a second flux of atoms of a magnetic material can be sent to the dots, at oblique incidences relative to the normal to the plane of the array, to form magnetic deposits on a plurality of sides of each dot.

According to another particular embodiment of the process forming the object of the invention, the magnetic material deposited on top of the dots and at the base of the trenches is eliminated, this elimination resulting for example from ionic abrasion at an oblique incidence relative to the normal to the plane of the array, with an angle of incidence opposite that of the first flux.

According to another particular embodiment of the process forming the object of the invention, a second flux of atoms is sent, at the same time as the first flux, at an oblique incidence relative to the plane of the array, with an angle of incidence opposite that of the first flux, with the intensity and the nature of the atoms of the second flux being capable of resulting, along with the first flux, in the formation of a non-magnetic alloy on top of the dots and at the base of the trenches.

In this case, after the atoms of the first and second fluxes have been deposited, these first and second fluxes are inverted and the fluxes thus inverted are sent to the dots, or the array is turned 180° around the normal to the plane of the array and the first and second fluxes are again sent, in order to obtain deposit of the atoms of the first and second fluxes on two opposite sides of each dot.

In the present invention, it is possible to form the thin layer in the presence of an external magnetic field, or after forming the thin layer, to thermally treat this thin layer in the presence of an external magnetic field, or to make a deposit of a layer of an antiferromagnetic material above or below the thin layer, so as to induce an axis of magnetic anisotropy in the plane of this thin layer.

In the invention, the dots can have a transverse, circular or elliptical section parallel to the plane of the array, the thin layer formed laterally on each dot thus having a lateral thickness gradient, and this gradient is used to induce an axis of magnetic anisotropy perpendicular to the plane of the array.

In the invention, a protective layer can also be formed on the entire surface of the array, then this surface provided with the protective layer can be planarized to eliminate any relief.

Certainly, the technique of depositing material at oblique incidence is known, but has never been used for producing structures of the type of those, which form the object of the present invention.

In the field of magnetic structures, this deposit at oblique incidence has been used only for depositing a magnetic material onto the side of a single line of etched silicon. In this respect, reference is made to the following document:

[2] K. Matsuyama, S. Komatsu, Y. Nozaki, 'Magnetic properties of nanostructures wires deposited on the side edge of patterned thin film', Journal of Applied Physics 87, 4724 (2000).

BRIEF DESCRIPTION OF THE DRAWINGS

The present invention will be better understood from reading the description of the embodiments given hereinbelow, purely indicatively and in no way limiting, with reference to the attached drawings, in which.

DETAILED DESCRIPTION OF PARTICULAR EMBODIMENTS

Figure 1:
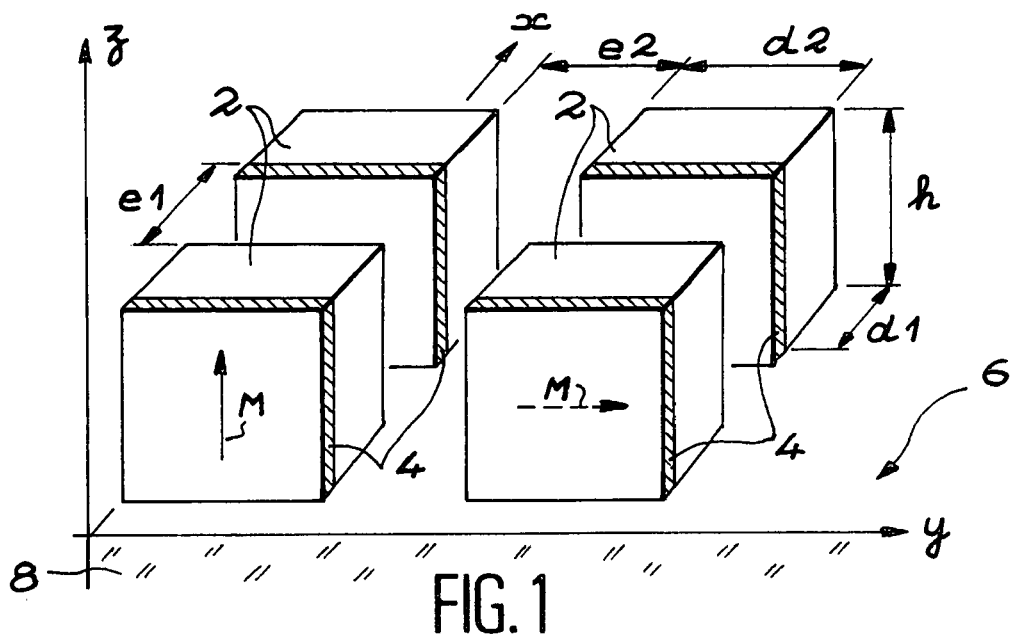
FIG. 1 is a schematic and partial perspective view of a particular embodiment of the magnetic information storage medium, forming the object of the invention, FIGS. 2A and 2B schematically illustrate processes for producing this magnetic medium.

FIG. 1 is a schematic and partial perspective view of a particular embodiment of a magnetic information storage memory, which is composed from an array of submicronic dots 2.

These dots 2 are for example made of silicon, glass, aluminium or hardened polymer resin. The dimensions of the dots 2 as well as the spaces between adjacent dots are in a range from 10 nm to 500 nm.

In this example the array of dots comprises lines and columns of parallelepipedic dots, the space between two adjacent lines is referenced as e1, the space between two adjacent columns is referenced as e2, each dot at a height h, a depth d1, counted parallel to the columns, and a width d2, counted parallel to the lines, and each of these dimensions e1, e2, h, d1 and d2 belongs to the abovementioned range. If dots having a transverse circular section (respectively elliptical) were to be used, the diameter (respectively the large axis and the small axis) of these dots would belong to this range.

Deposited on each of the dots 2 is a single thin layer, made from a classic magnetic material (for example a ferromagnetic material), at oblique incidence.

An aim of the present invention is to effect magnetic deposit solely on one side or a plurality of sides of the dots. In the example in FIG. 1, this magnetic deposit 4 is formed on a single side of the dots 2.

A frame (x, y, z) is defined, wherein each of the axes x, y, z is perpendicular to the two others. The plane (x, y) is the plane of the array, that is, the plane of the surface 6 of the substrate 8 from which the dots 2 are formed. The lines of the array are parallel to the axis y and its columns, to the axis x.

The axis z is perpendicular to this plane (x, y) and the plane (x, z) is the plane of incidence of the flux of material from which the deposit 4 is formed on each dot, that is, the plane to which this flux is parallel.

The result is that the magnetisation of the deposit 4 formed on the side of each of the dots 2 is parallel to the plane (y, z) in the case of a magnetic material of planar magnetisation. This magnetisation, referenced as M in FIG. 1, can be directed along the axis y or along the axis z.

In addition, if the axis of magnetic anisotropy can be oriented according to the axis z, constantly parallel to the plane (y, z), the result is the equivalent of a material with perpendicular magnetisation.

However, with such orientation, an information storage medium according to the present invention has a higher magnetic signal (since the magnetic material utilised is pure and its total thickness is not limited) and more spatially localised than an information storage medium utilising a material with perpendicular magnetisation.

Such a medium according to the present invention also has greater deposit simplicity of the magnetic layer, as well as superior thermal stability, which allows total compatibility with conventional technical production processes of information storage media.

A process for producing an information storage medium according to the present invention will be explained hereinbelow.

1) An array of dots of square, rectangular, circular or elliptical section is used, said array being obtained by a classic nanolithography process or by the technique of nano-imprint from a substrate. The substrate is for example made of silicon, glass, aluminium or hardened polymer resin.

2) To form the magnetic deposits, a classic technique for depositing thin metallic layers is used, for example cathodic sputtering or evaporation under vacuum.

3) The angle of incidence of the flux 10 (FIGS. 2A and 2B) of atoms of the magnetic material relative to the normal (axis z) to the plane (x, y) of the array of dots 2 is around 45°, and this flux 10 is parallel to the plane (x, z) which forms the plane of incidence. In addition, this flux is collimated (by means not shown here) so as to be the least divergent possible.

4) The angle of incidence, the height h of the dots 2 and the distance e1 between dots are selected in such a way that each dot forms a screen between the incident flux 10 and the following dot (in the direction of flux), so that there is or is not, according to the desired result, continuity between the deposit formed on the side of each dot and the deposit formed at the base of the trench 12 separating this dot from the following dot (this trench 12 being parallel to the axis y and separating two lines of dots). Three of the four sides of each dot as well as the part of the trench situated behind each dot (observed in the direction of the flux 10) are thus protected and do not receive any deposit.

Figure 2A:
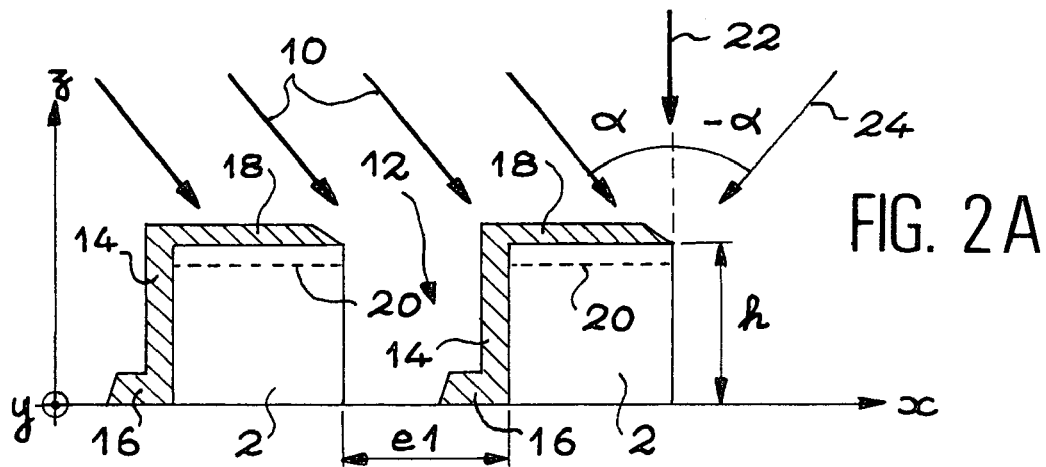

In the case of FIG. 2A, the angle of incidence α is sufficiently small, considering the distance between dots and the height thereof, so that there is continuity between the deposit 14 formed on the side of a dot and the deposit 16 formed at the base of the adjacent trench 12.

Figure 2B:
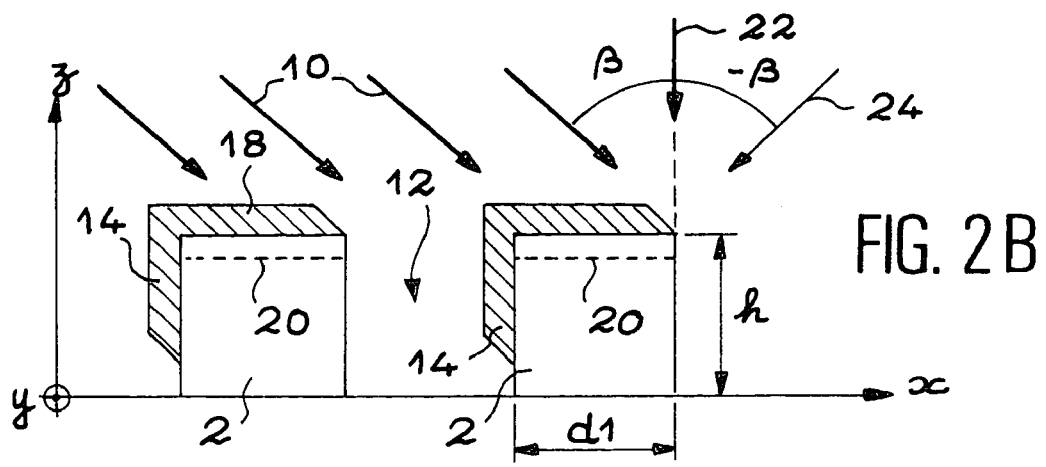

In the case of FIG. 2B, the angle of incidence, designated β, is greater and leads to non-continuity of the two deposits 14 and 16, the deposit not appearing on FIG. 2B because of the shadowing provided by the adjacent dot. It should be noted that there is always a deposit in the trenches which are parallel to the axis x and thus separate the columns of dots from one another.

5) The flux incident 10 is composed of atoms of a magnetic material (mainly iron, cobalt, nickel or alloys of the latter), and possibly containing other elements introduced in variable quantity (for example chromium, tantalum, platinum, molybdenum and terbium) for the purpose of adjusting the magnetic properties of the deposit.

6) Three different deposits are thus obtained:

a magnetic deposit 18 on the top of the dots 2 (in any form, for example substantially square or rectangular parallel to the plane (x, y), or substantially round or elliptical, as is also indicated hereinbelow), a magnetic deposit 14 on one of the sides of the dot (of square or rectangular form parallel to the plane (y, z)), and a magnetic deposit, not shown, in the trenches parallel to the plane (x, z).

7) The magnetic signal emanating from the top of the dots and from the base of the trenches parallel to the axis x is neutralised by one of the means (A), (B) and (C) which are detailed hereinbelow.

(A) If the array of dots is formed by a classic nanolithography process (comprising insolation of a photosensitive resin, then selective ionic abrasion), on completion of the production process for the dots, the film of photosensitive resin 20 is preserved, having served as mask on the top of the dots. After deposit of the magnetic material, a solvent enables the photosensitive resin to be removed and the magnetic deposit 18 formed on the top of the dots.

The deposit of magnetic material in the base of the trenches which are parallel to the axis x is not inconvenient, since it gives out a much weaker magnetic signal, given its distance from the apex of the dots. In addition, this deposit has the form of continuous parallel lines (that is, very long compared to the size of the dots) and thus radiates a much weaker magnetic field than that of the deposit formed on the side of the dots.

This deposit formed at the base of the trenches is also advantageously utilisable for canalising the lines of magnetic field emanating from a given dot, which enables the state of magnetisation of the neighbouring dots not to be disturbed during the writing process.

If it is wished that this deposit formed at the base of the trenches to have a coercivity different from that of the deposit formed on the side of the dots, another material can be deposited at the same time as the magnetic material previously mentioned, at a normal incidence (flux 22 in FIGS. 2A and 2B) or at an oblique incidence (flux 24 in FIGS. 2A and 2B), though opposed to that of the flux 10: in FIGS. 2A and 2B, the flux 24 is parallel to the plane (x, z) but makes an angle −α (FIG. 2A) or −β (FIG. 2B) with the axis z.

According to the nature and the rate of deposit of this other material, the coercivity of the alloy deposited at the base of the trenches can be varied, said alloy resulting from the simultaneous deposit of the two materials.

(B) After having formed the deposit of magnetic material (flux 10 of FIGS. 2A and 2B), ionic abrasion is carried out at an oblique incidence and opposite to that which is utilised to form this deposit, with this ionic abrasion accordingly taking place along arrow 24 of FIGS. 2A and 2B.

This allows the magnetic material deposited on the top of the dots and at the base of the trenches parallel to the axis x to be removed without disturbing the deposit formed on the side of the dots.

(C) At the same time as the magnetic material is deposited, a non-magnetic material, for example chromium, is deposited at a normal incidence to the plane of the array of dots (arrow 22 of FIGS. 2A and 23) or at an oblique incidence and opposite to that of the flux 10 and thus following arrow 24 of FIGS. 2A and 2B. The magnetic material thus forms an alloy with the non-magnetic material on the top of the dots and at the base of the trenches parallel to the axis x, the amount of material deposited on the sides of the dots being negligible in the case of normal incidence to the plane of the array of dots.

The rate of deposit and the nature of the non-magnetic material are selected such that the formed alloy is itself non-magnetic.

It is also possible, (1) using the processes (A) and (C), to carry out a plurality of successive deposits and to turn the array of dots by 90° or 180° in its plane between two successive deposits.

By way of example, in case (A), a first deposit of magnetic material can be made, then the array can be turned, then a second deposit of the other material can be made and, in case (C), a first deposit of magnetic material can be made, then the array can be turned, then a second deposit of non-magnetic material can be made. The array can then be turned again, then the first deposit can be made, then the array can be turned, then the second deposit can be made and so on.

It is also possible, (2) using the process (A), to use a plurality of fluxes of atoms of magnetic materials at oblique incidence.

In cases (1) and (2) above, magnetic deposits are made on several sides of the dot, which increases the information density.

Figure 4:
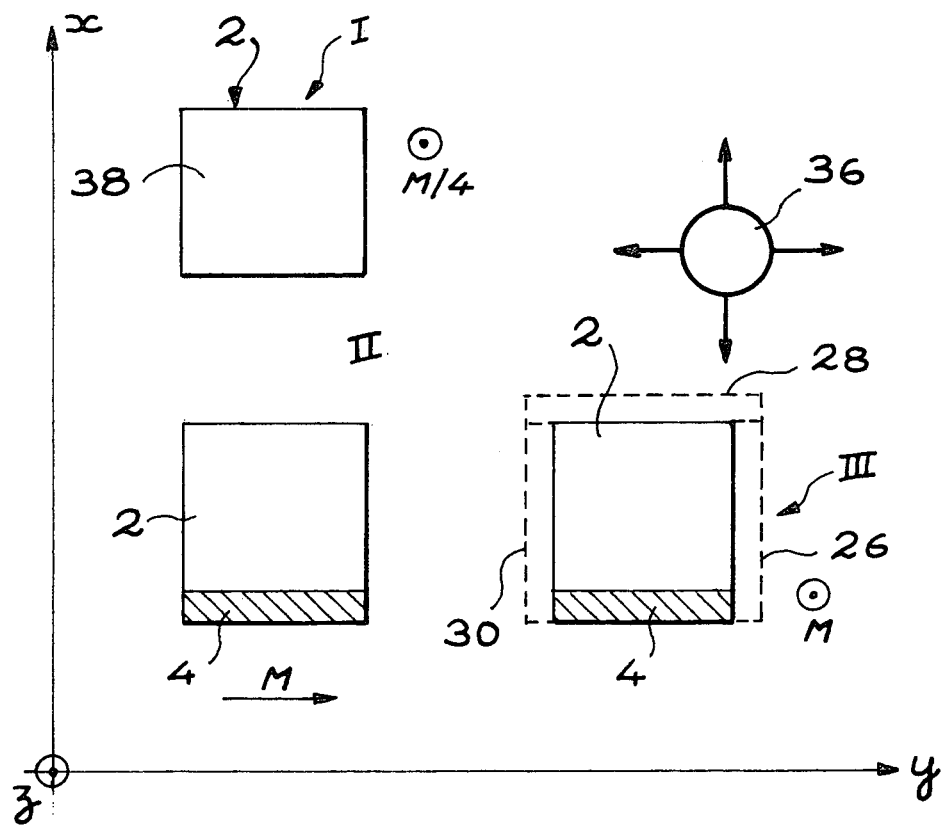
FIG. 4 is a schematic illustration of different cases considered for calculation of the component, following an axis normal to the plane of an array of dots of a medium according to the present invention, of the existing magnetic field above this array.

This is schematically illustrated in a plan view in FIG. 4 in which a dot 2 is seen, a side of which is provided with the magnetic deposit 4 and the other sides of which are respectively provided with magnetic deposits 26, 28 and 30.

8) An easy axis of magnetic anisotropy is induced in the vertical deposit 14 on the side of each of the dots, this axis capable of being directed either parallel to the plane of the array of dots, that is, along the axis y, or perpendicularly to this plane that is, along the axis z.

This can be realised either by forming the deposit of magnetic material on the dots in the presence of an external magnetic field oriented along one of the axes y and z, or by carrying out thermal treatment after this deposit in the presence of such a magnetic field.

If dots of transversal, circular or elliptical section (section perpendicular to the axis z) are used, perpendicular magnetic anisotropy, that is, along the axis z, is favoured by the lateral gradient of thickness resulting from the used deposit geometry.

Figure 3:
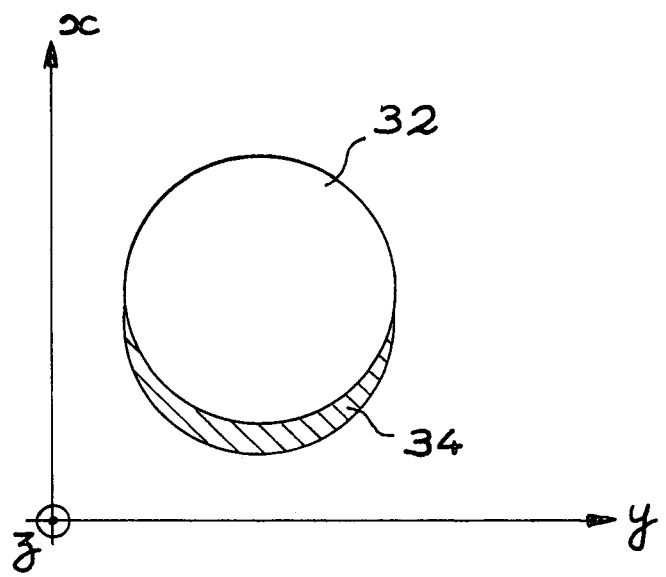
FIG. 3 is a schematic plan view of a dot of circular section forming part of a magnetic medium according to the present invention.

FIG. 3 is a schematic plan view, that is, along the axis z, of a dot 32 of circular section. The deposit of magnetic material formed on the side of this dot, at oblique incidence, parallel to the plane (x, z), has reference numeral 34.

An information storage medium according to the present invention could thus comprise an array of dots of the type of dot 32, formed on the same substrate, the plane of the array being the plane (x, y).

9) If the easy axis of magnetic anisotropy is perpendicular to the plane of the array of dots, the equivalent of a material with perpendicular magnetic anisotropy is obtained, since the magnetic material with planar anisotropy (which is the case of iron, cobalt, nickel or their alloys in thin layers) has been deposited on the side of the dots, the side which is perpendicular to the plane of the array.

The invention offers various advantages relative to conventional materials with perpendicular anisotropy, for example ordered alloys such as CoPt and FePt or multilayers such as Co/Pt and Fe/Pt:

it is very easy to form the lateral deposit of magnetic material (in fact a single layer of magnetic material), contrary to producing an ordered alloy, epitaxied on a monocrystalline substrate, or a multilayer comprising layers whereof the thickness is a fraction of a nanometre. In addition, all the magnetic materials with planar magnetisation currently employed for production of information storage media can be used.

This deposit of magnetic material has considerable thermal stability compared to that of multilayers composed of very thin layers of cobalt, nickel, iron, palladium and/or platinum: there is no risk of the elements interdiffusing, leading to the loss of magnetic properties. This considerable thermal stability renders the structure of the medium forming the object of the invention compatible with existing technological processes and also enables thermal treatment under a magnetic field at high temperature to be envisaged so as to induce an axis of magnetic anisotropy in the deposits formed on the dots of a medium according to the present invention, or to modify the magnetic properties of these deposits.

The total thickness of the material deposited on an dot can be much greater than in the case of the multilayers with perpendicular magnetisation.

The magnetic signal generated by the lateral magnetic deposit is more intense than that generated by an alloy or by a multilayer of total equivalent thickness since, in the present invention, it is possible to use magnetic alloys having strong magnetisation, which do not present perpendicular magnetic anisotropy.

This magnetic signal depends much less on the size of the dots: for a deposit formed on the horizontal surface of a square dot, reduction by a factor of 2 of the lateral size of the dot leads to a reduction by a factor of 4 of the magnetic volume, whereas, for a deposit formed on the side of this dot, this reduction factor is equal only to 2.

This magnetic signal is much more localised on the array of dots: for a magnetic deposit of 10 nm in thickness formed on the side of a dot of square transverse section, of 200 nm sides, the horizontal surface occupied by this deposit is twenty times weaker than that of the same deposit, formed on top of the dot. This allows possible magnetic interactions, with constant information density relative to a deposit on the top of the dots, to be reduced, or inversely allows the information density for equivalent magnetic interactions to be increased.

Purely indicatively and in no way limiting, consider a dot of height h (in nm) of square section, of side L (in nm). It is supposed that magnetisation of the lateral magnetic layer of this dot is directed along the axis z and this magnetic layer is considered as being a magnetic dipole.

In the case of a magnetic deposit of thickness t (in nm) formed on the side of the dot, the magnetic volume is L×h×t nm$^3$, for a horizontal surface of L×t nm$^2$, resulting in a magnetic density (magnetisation quantity per unit of surface) equal to h (in arbitrary units).

If this lateral deposit is compared with a conventional deposit of t nm of a multilayer $(Co_{0.5\ nm}/Pt_{1.5\ nm})_{t/2}$ formed on the top of the same dot, the magnetic volume is of the order of 0.5×t/2×L×L nm$^3$, for a horizontal surface of L×L nm$^2$, resulting in a magnetic density of t/4. The resulting gain is therefore equal to 4h/t.

The signal gain is proportional to the quantity of magnetic material and is therefore 4 in this example where the two deposits being considered have the same thickness, but where the multilayer contains four times less cobalt than the single layer.

In summary, the present invention makes it possible to have a much more intense magnetic signal and this on a much weaker lateral surface. This is all the more relevant since, in the case of a multilayer $(Co_{1/4}/Pt_{3/4})$, magnetisation of such layers of cobalt, a fraction of a nanometre in thickness, is weaker than that of the bulk cobalt, on the one hand due to reduction of the magnetic moment generally observed in the ultra-thin layers (there is formation of an interface alloy) and, on the other hand, due to reduction of the temperature of magnetic order.

If the easy axis of magnetic anisotropy is parallel to the plane of the array of dots, there is no gain in signal quantity, given that the same magnetic layer is deposited either on the top or on the side of each of the dots of the array, and the resulting gain in localisation is of the order of h/t relative to a conventional material having planar anisotropy.

In a more quantitative manner and with reference to FIG. 4, if we know the volume and the magnetisation per unit of volume of the deposit, the value of its surface parallel to the plane (x, y) of the array of dots and the flying height of a reading head 36 which is supposed to be pointlike and which moves vertically to the magnetic deposit, along the axis y for cases I and II and along the axis y or the axis x for case III, then it is possible to calculate the component Hz, along the axis z, of the magnetic field radiated by each dot above the array of dots for different geometries of deposit:

(I) deposit, on the top of the dots 2, of a multimagnetic layer 38 10 nm in thickness, with perpendicular magnetisation of intensity M/4, directed along the axis z, (II) deposit, on the side of the dots 2, of a magnetic layer 4 10 nm in thickness, with planar magnetisation of intensity M, directed along the axis y, (III) deposit on the side of the dots 2, of a magnetic layer 4 10 nm in thickness, with planar magnetisation of intensity M, directed along the axis z.

Figure 5:
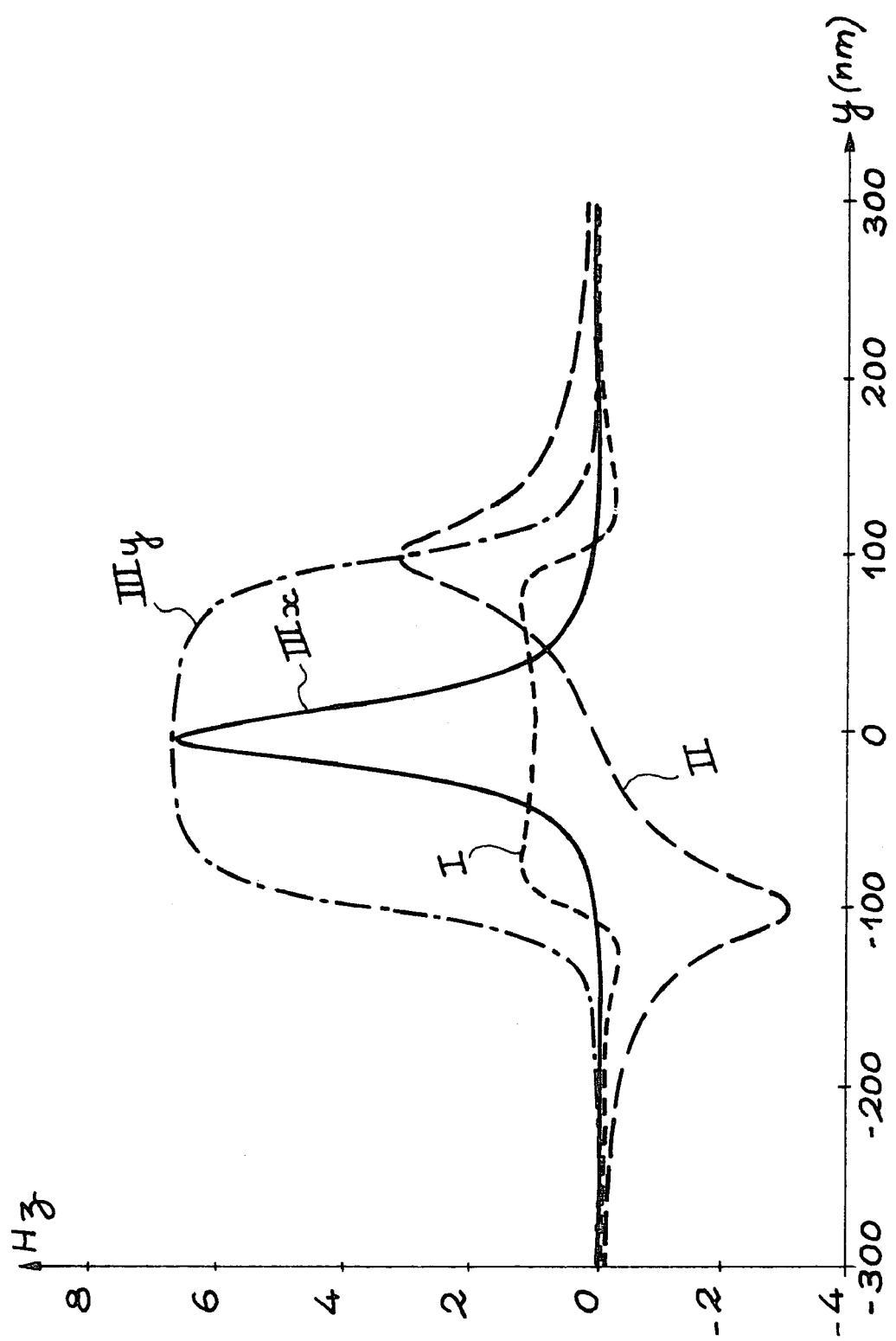
FIG. 5 depicts the variations of this component as a function of the distance to the centre of a dot, in these different cases in question.

FIG. 5 makes it possible to compare the variations of Hz (in arbitrary units) as a function of the distance y (in nm) at the centre of the dot (parallel to the axis y), for a magnetic field radiated at a distance of 20 nm above the surface of the dot which is supposed to be cubic, 200 nm in side, in these three cases (I) to (III), the displacement of the reading head 36 being made along the axis y for cases (I) and (II) and along the axis y or the axis x for the case (III).

The curves I, II, IIIy and IIIx of the FIG. 5 correspond respectively to case I, to case II, to case III with displacement along the axis y and to case III with displacement along the axis x.

It is observed that, relative to the case (I) of the multilayer with perpendicular magnetisation, the value of Hz is around 3 times stronger in the case (II) of the deposit on the side of the dot with magnetisation directed along the axis y, and around 7 times stronger in the case (III) of the deposit on the side of the dot with magnetisation directed along the axis z.

In addition, if the reading head is displaced along the axis x in case (III), then the spatial extension of the signal is much weaker than in the case of displacement along the axis y (the width at half maximum of the signal is around 5 times weaker), which causes much better separation of the signals emanating from the different dots and also leads to a decrease in magnetostatic coupling between dots.

After forming the deposit of magnetic material on the side of the dots of the array, it is possible to form a protective layer, for example made of silica, on the entire surface of the array of dots, then to planarise this surface to eliminate any relief.

It should be noted that, in the present invention, the dots can be in any shape at all; for example, they can have a square, triangular, elliptical or round section.

In addition, each dot can contain a magnetic domain or a plurality of magnetic domains. By way of example, with a dot square in section, it is possible to get four magnetic domains. But these magnetic domains must be separated.

In addition, with reference to point 8 mentioned above, it is specified that in the invention another manner of inducing an axis of magnetic anisotropy in the plane of the thin layer is to make a deposit of a layer of an antiferromagnetic material above or below the thin layer. This antiferromagnetic layer is for example NiO, FeMn or PtMn. By way of example, this layer can be a few nanometres in thickness.

The invention claimed is:

1. An information storage medium, said medium comprising an array of dots of submicronic dimensions, said array being formed on a substrate, said dots being raised portions above the surface of the substrate, each dot containing at least one magnetic domain which has a direction of magnetization and corresponds to a bit defined by this direction of magnetization, said magnetic domain being formed by a layer of at least one magnetic material which laterally covers at least one of the sides of said dot and reaches the apex of said dot without extending along the top of said dot, wherein each said layers of at least one magnetic materials directly contacts only a single dot, and wherein each of said dots is separated from the next closest dot by a space on all sides of each of said dots.

2. The medium as claimed in claim 1, wherein the direction of magnetisation is perpendicular to the plane of the array of dots.

3. A storage medium comprising:
   a substrate;
   a plurality of dots, said dots being raised portions above the surface of said substrate, comprising a silicon based material, wherein each of the plurality of dots has submicronic dimensions and is substantially in a cubical shape; and
   a layer of magnetic material configured to laterally cover at least a portion of one side of said dot, wherein each of the plurality of dots covered with the layer of magnetic material is configured to store information, wherein each dot contains at least one magnetic domain which has a direction of magnetization and corresponds to a bit defined by the direction of magnetization, said magnetic domain being formed by said layer of magnetic material, wherein said layer of magnetic material reaches the apex of said dot without extending along the top of said dot, wherein each said layers of at least one magnetic materials directly contacts only a single dot, and wherein each of said dots is separated from the next closest dot by a space on all sides of each of said dots.

4. The storage medium as claimed in claim 3, wherein each of the plurality of the dot has a dimension from 10 nanometer ("nm") to 500 nanometer ("nm").

5. The storage medium as claimed in claim 3, wherein the plurality of dots is arranged in an array form.

6. The storage medium as claimed in claim 5, wherein the thin layer of magnetic material includes iron, nickel, cobalt, or alloy.

7. The storage medium as claimed in claim 5, wherein the thin layer of magnetic material includes chromium, tantalum, platinum, molybdenum or terbium.

\* \* \* \* \*